(12) United States Patent
Chen et al.

(10) Patent No.: US 11,315,861 B2
(45) Date of Patent: Apr. 26, 2022

(54) METHOD FOR FORMING A HOMOGENEOUS BOTTOM ELECTRODE VIA (BEVA) TOP SURFACE FOR MEMORY

(71) Applicant: Taiwan Semiconductor Manufacturing Co., Ltd., Hsin-Chu (TW)

(72) Inventors: Hsia-Wei Chen, Taipei (TW); Wen-Ting Chu, Kaohsiung (TW); Yu-Wen Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 72 days.

(21) Appl. No.: 16/732,413

(22) Filed: Jan. 2, 2020

(65) Prior Publication Data
US 2020/0144172 A1 May 7, 2020

Related U.S. Application Data

(60) Continuation of application No. 16/202,493, filed on Nov. 28, 2018, now Pat. No. 10,529,658, which is a
(Continued)

(51) Int. Cl.
*H01L 23/498* (2006.01)
*H01L 23/532* (2006.01)
(Continued)

(52) U.S. Cl.
CPC ...... *H01L 23/49827* (2013.01); *H01L 21/768* (2013.01); *H01L 21/76804* (2013.01);
(Continued)

(58) Field of Classification Search
CPC ........... H01L 23/49827; H01L 45/1675; H01L 23/522; H01L 45/16; H01L 45/04;
(Continued)

(56) References Cited

U.S. PATENT DOCUMENTS 5,973,348 A * 10/1999 Ishibashi ................ H01L 28/91
257/306
6,495,449 B1 * 12/2002 Nguyen ............ H01L 21/76846
257/E21.592
(Continued)

FOREIGN PATENT DOCUMENTS

CN 104051287 A 9/2014
JP 5723311 B2 5/2015

OTHER PUBLICATIONS

Nakakubo, et al. "Characterization of Plasma Process-Induced Latent Defects in Surface and Interface Layer of Si Substrat." ECS Journal of Solid State Science and Technology, 4 (6) N5077-N5083 (2015).
(Continued)

*Primary Examiner* — Marcos D. Pizarro
(74) *Attorney, Agent, or Firm* — Eschweiler & Potashnik, LLC

(57) ABSTRACT

Various embodiments of the present application are directed towards an integrated circuit comprising a memory cell on a homogeneous bottom electrode via (BEVA) top surface. In some embodiments, the integrated circuit comprises a conductive wire, a via dielectric layer, a via, and a memory cell. The via dielectric layer overlies the conductive wire. The via extends through the via dielectric layer to the conductive wire, and has a first sidewall, a second sidewall, and a top surface. The first and second sidewalls of the via are respectively on opposite sides of the via, and directly contact sidewalls of the via dielectric layer. The top surface of the via is homogenous and substantially flat. Further, the top surface of the via extends laterally from the first sidewall of the via to the second sidewall of the via. The memory cell is directly on the top surface of the via.

20 Claims, 11 Drawing Sheets

Related U.S. Application Data division of application No. 15/715,487, filed on Sep. 26, 2017, now Pat. No. 10,276,485.

(60) Provisional application No. 62/540,284, filed on Aug. 2, 2017.

(51) Int. Cl.
  *H01L 45/00* (2006.01)
  *H01L 23/522* (2006.01)
  *H01L 43/08* (2006.01)
  *H01L 21/768* (2006.01)
  *H01L 43/12* (2006.01)
  *G11C 11/16* (2006.01)

(52) U.S. Cl.
  CPC .......... *H01L 23/498* (2013.01); *H01L 23/522* (2013.01); *H01L 23/5226* (2013.01); *H01L 23/53261* (2013.01); *H01L 43/08* (2013.01); *H01L 43/12* (2013.01); *H01L 45/04* (2013.01); *H01L 45/1233* (2013.01); *H01L 45/1253* (2013.01); *H01L 45/16* (2013.01); *H01L 45/1675* (2013.01); *G11C 11/161* (2013.01)

(58) Field of Classification Search
  CPC ... H01L 43/08; H01L 21/768; H01L 45/1233; H01L 23/498; H01L 43/12; H01L 23/53261; H01L 21/76804; H01L 21/7684; H01L 23/5226; H01L 45/12; H01L 45/1253; G11C 11/161
  See application file for complete search history.

(56) References Cited

U.S. PATENT DOCUMENTS

| | | | |
|---|---|---|---|
| 9,209,392 B1 | 12/2015 | Sung et al. | |
| 2004/0026682 A1 | 2/2004 | Jiang | |
| 2004/0238964 A1 | 12/2004 | Kawano et al. | |
| 2006/0019431 A1 | 1/2006 | Kasko et al. | |
| 2009/0127604 A1 | 5/2009 | Noda | |
| 2010/0164121 A1 | 7/2010 | Feustel et al. | |
| 2014/0166961 A1 | 6/2014 | Liao et al. | |
| 2014/0203236 A1* | 7/2014 | Chen | H01L 45/16 257/4 |
| 2014/0252295 A1 | 9/2014 | Liao et al. | |
| 2014/0264930 A1* | 9/2014 | Yu | H01L 24/13 257/774 |
| 2014/0269005 A1 | 9/2014 | Kang | |
| 2014/0365688 A1 | 12/2014 | Lee et al. | |
| 2015/0052302 A1 | 2/2015 | Dong et al. | |
| 2015/0102459 A1 | 4/2015 | Lai et al. | |
| 2015/0318333 A1* | 11/2015 | Narayanan | H01L 45/16 257/4 |
| 2016/0049584 A1 | 2/2016 | Dang et al. | |
| 2016/0204344 A1 | 7/2016 | Hsieh et al. | |
| 2016/0248008 A1 | 8/2016 | Chen et al. | |
| 2016/0268499 A1 | 9/2016 | You et al. | |
| 2016/0268505 A1 | 9/2016 | Sung et al. | |
| 2016/0351806 A1 | 12/2016 | Hsieh et al. | |
| 2017/0170386 A1 | 6/2017 | Chuang et al. | |

OTHER PUBLICATIONS

Non-Final Office Action dated Oct. 1, 2018 for U.S. Appl. No. 15/715,487.

Notice of Allowance dated Jan. 17, 2019 for U.S. Appl. No. 15/715,487.

Non-Final Office Action dated Oct. 4, 2019 for U.S. Appl. No. 16/202,493.

Notice of Allowance dated Nov. 27, 2019 for U.S. Appl. No. 16/202,493.

\* cited by examiner

METHOD FOR FORMING A HOMOGENEOUS BOTTOM ELECTRODE VIA (BEVA) TOP SURFACE FOR MEMORY

REFERENCE TO RELATED APPLICATIONS

This Application is a Continuation of U.S. application Ser. No. 16/202,493, filed on Nov. 28, 2018, which is a Divisional of U.S. application Ser. No. 15/715,487, filed on Sep. 26, 2017 (now U.S. Pat. No. 10,276,485, issued on Apr. 30, 2019), which claims the benefit of U.S. Provisional Application No. 62/540,284, filed on Aug. 2, 2017. The contents of the above-referenced Patent Applications are hereby incorporated by reference in their entirety.

BACKGROUND

Many modern day electronic devices include non-volatile memory. Non-volatile memory is electronic memory that is able to store data in the absence of power. Some promising candidates for the next generation of non-volatile memory include resistive random-access memory (RRAM) and magnetoresistive random-access memory (MRAM). RRAM and MRAM have relatively simple structures, and are compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
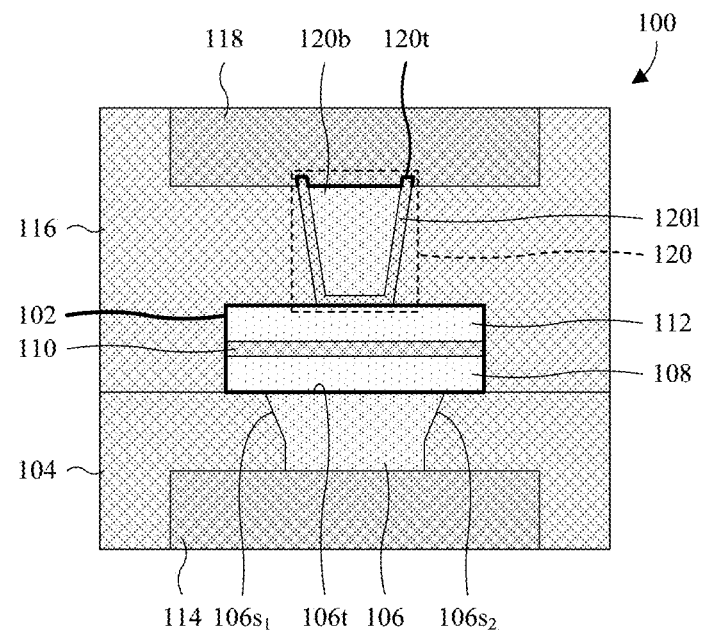
FIG. 1 illustrates a cross-sectional view of some embodiments of an integrated circuit (IC) comprising a memory cell on a homogeneous bottom electrode via (BEVA) top surface.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to a method for forming an integrated circuit (IC), a bottom electrode via (BEVA) dielectric layer is formed covering a metal wire of a back-end-of-line (BEOL) interconnect structure. An etch is performed into the BEVA dielectric layer to form a BEVA opening exposing the metal wire. A metal blocking layer is formed covering the BEVA dielectric layer and conformally lining the BEVA opening. A metal layer is formed covering the metal blocking layer and filling a remainder of the BEVA opening over the metal blocking layer. A planarization is performed into the metal layer and the metal blocking layer until the BEVA dielectric layer is reached, thereby forming a BEVA in the BEVA opening. The BEVA comprises a BEVA body formed from the metal layer, and further comprises a BEVA liner lining the BEVA body and formed from the metal blocking layer. A memory cell is then formed directly on a top surface of the BEVA.

A challenge with the method is that the metal layer and the metal blocking layer have different hardness values, such that the planarization removes the metal layer and the metal blocking layer at different rates. Accordingly, the top surface of the BEVA is uneven. For example, a top surface of the BEVA body may be vertically offset from a top surface of the BEVA liner. Because the top surface of the BEVA is uneven, the electric field across the memory cell is non-uniform. The non-uniform electric field may, in turn, lead to poor yield and/or non-uniform performance during bulk manufacture of the IC. As feature sizes continue to shrink in ICs, BEVAs and memory cells will also shrink, such that electric field uniformity will be increasingly important in memory ells.

In view of the foregoing, various embodiments of the present application are directed towards an IC comprising a memory cell on a homogeneous BEVA top surface, as well as a method for forming the IC. In some embodiments, the IC comprises a conductive wire, a via dielectric layer, a via, and a memory cell. The via dielectric layer overlies the conductive wire. The via extends through the via dielectric layer to the conductive wire, and has a first sidewall, a second sidewall, and a top surface. The first and second sidewalls of the via are respectively on opposite sides of the via, and directly contact sidewalls of the via dielectric layer. The top surface of the via is homogenous and substantially flat. Further, the top surface of the via extends laterally from the first sidewall of the via to the second sidewall of the via. The memory cell is directly on the top surface of the via. Because the top surface of the via is substantially flat, the electric field across the memory cell is uniform or substantially uniform.

In some embodiments, the method comprises forming a via dielectric layer covering a conductive wire. An etch is performed into the via dielectric layer to form an opening overlying and exposing the conductive wire. A conductive layer is formed covering the via dielectric layer and completely filling the opening. The conductive layer is homogeneous and directly contacts sidewalls of the via dielectric layer in the opening. A planarization is performed into a top of the conductive layer until the via dielectric layer is reached to form a via in the opening from the conductive layer. A memory cell is formed directly on the via. Because the conductive layer is homogeneous, the conductive layer has a substantially uniform hardness and the planarization removes the conductive layer at a substantially uniform rate. This, in turn, forms the via so the top surface of the via is substantially flat. Because the top surface of the via is substantially flat, the electric field across the memory cell is uniform or substantially uniform.

With reference to FIG. 1, a cross-sectional view 100 of some embodiments of an IC comprising a memory cell 102 is provided. As illustrated, the memory cell 102 is on a lower dielectric layer 104 and a BEVA 106. The memory cell 102 reversibly changes between a first data state and a second data state depending upon a voltage applied across the memory cell 102. In some embodiments, the memory cell 102 is a resistive random-access memory (RRAM) cell, a magnetoresistive random-access memory (MRAM) cell, or some other type of memory cell. Further, in some embodiments, the memory cell 102 comprises a bottom electrode 108, a data storage element 110, and a top electrode 112.

The bottom electrode 108 overlies the lower dielectric layer 104 and the BEVA 106. In some embodiments, the bottom electrode 108 directly contacts a top surface 106t of the BEVA 106. In some embodiments, the bottom electrode 108 is the same material as the BEVA 106, and/or is integrated with the BEVA 106. For example, the bottom electrode 108 and the BEVA 106 may be formed by the same deposition. The bottom electrode 108 may be or comprise, for example, tantalum nitride, titanium nitride, platinum, iridium, ruthenium, tungsten, silver, copper, some other conductive material, or any combination of the foregoing.

The data storage element 110 overlies the bottom electrode 108, and the top electrode overlies the data storage element 110. The data storage element 110 reversibly changes between a first data state and a second data state depending upon a voltage applied across the memory cell 102. In some embodiments where the memory cell 102 is a RRAM cell, the data storage element 110 is or comprises hafnium oxide, some other high κ dielectric, or some other dielectric. As used herein, a high κ dielectric is a dielectric with a dielectric constant κ greater than about 3.9, 5, 10, 15, or 20. In some embodiments where the memory cell 102 is a MRAM cell, the data storage element 110 is or comprises a magnetic tunnel junction (MTJ). The top electrode 112 may be or comprise, for example, titanium nitride, tantalum nitride, platinum, iridium, tungsten, some other conductive material, or any combination of the foregoing.

The BEVA 106 extends from a bottom of the memory cell 102, through the lower dielectric layer 104, to a lower wire 114 underlying the memory cell 102. The lower wire 114 is in the lower dielectric layer 104 and may be or comprise, for example, aluminum copper, copper, aluminum, some other conductive material, or any combination of the foregoing. The lower dielectric layer 104 may be or comprise, for example, silicon dioxide, silicon oxynitride, a low κ dielectric, silicon carbide, silicon nitride, some other dielectric, or any combination of the foregoing. As used herein, a low κ dielectric is a dielectric with a dielectric constant κ less than about 3.9, 3, 2, or 1. The BEVA 106 may be or comprise, for example, titanium, titanium nitride, tantalum, tantalum nitride, tungsten, or some other conductive material. In some embodiments, the BEVA 106 is completely homogenous (e.g., a single material).

The top surface 106t of the BEVA 106 is homogeneous (e.g., a single material), and is flat or substantially flat, such that an electric field produced across the memory cell 102 using the BEVA 106 is uniform or substantially uniform. Further, the top surface 106t of the BEVA 106 extends continuously from a first sidewall $106s_1$ of the BEVA 106 to a second sidewall $106s_2$ of the BEVA 106, where first and second sidewalls $106s_1$, $106s_2$ are on opposite sides of the BEVA 106 and contact sidewalls of the lower dielectric layer 104.

An upper dielectric layer 116 covers the lower dielectric layer 104, and accommodates an upper wire 118 and a TEVA 120. The upper dielectric layer 116 may be or comprise, for example, silicon dioxide, a low κ dielectric, silicon carbide, silicon nitride, some other dielectric, or any combination of the foregoing. The upper wire 118 may be or comprise, for example, aluminum copper, copper, aluminum, or some other conductive material.

The TEVA 120 is directly between the upper wire 118 and the memory cell 102, and extends from the upper wire 118, through the upper dielectric layer 116, to the memory cell 102. In some embodiments, the TEVA 120 is homogenous (e.g., a single material). In other embodiments, the TEVA 120 is heterogeneous and comprises a TEVA body 120b and a TEVA liner 120l. The TEVA body 120b may be or comprise, for example, copper, aluminum copper, aluminum, tungsten, or some other conductive material. The TEVA liner 120l blocks material of the TEVA body 120b from migrating (e.g., diffusing) out of the TEVA 120, and may be, for example, titanium nitride, tantalum nitride, tantalum, or some other conductive barrier material for the TEVA body 120b. In some embodiments in which the TEVA 120 is heterogeneous, a top surface 120t of the TEVA 120 is heterogeneous, and rough or uneven.

Figure 2A:
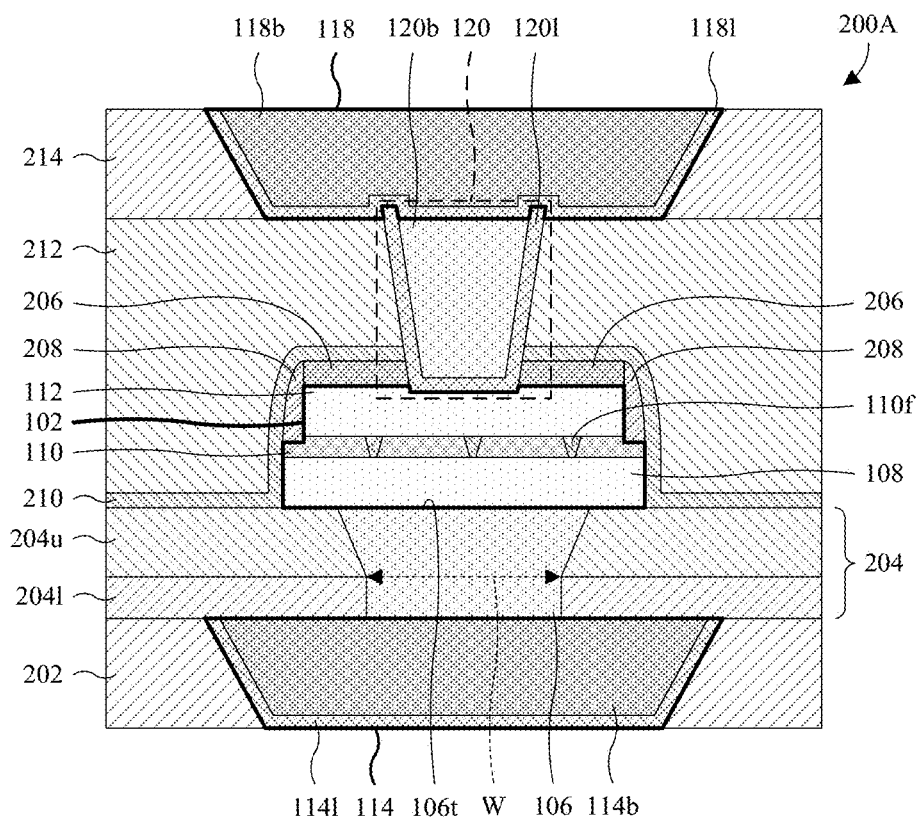
FIGS. 2A and 2B illustrate cross-sectional views of various more detailed embodiments of the IC of FIG. 1.

With reference to FIG. 2A, a cross-sectional view 200A of some more detailed embodiments of the IC of FIG. 1 is provided. As illustrated, the lower wire 114 is within a lower interlayer dielectric (ILD) layer 202. The lower ILD layer 202 may be or comprise, for example, silicon dioxide, silicon oxynitride, a low κ dielectric, silicon nitride, some other dielectric, or any combination of the foregoing. In some embodiments, the lower wire 114 comprises a lower wire body 114b and a lower wire liner 114l. The lower wire body 114b may be or comprise, for example, aluminum copper, copper, aluminum, some other metal, or some other conductive material. The lower wire liner 114l cups an underside of the lower wire body 114b so as to line a bottom surface of the lower wire body 114b and sidewalls of the lower wire body 114b. The lower wire liner 114l blocks material from the lower wire body 114b from migrating (e.g., diffusing) out of the lower wire body 114b, and may be or comprise, for example, tantalum, titanium, titanium nitride, tantalum nitride, or some other conductive barrier material for the lower wire body 114b.

A BEVA dielectric layer 204 overlies the lower wire 114 and the lower ILD layer 202, and accommodates the BEVA 106. In some embodiments, the BEVA dielectric layer 204 comprise a lower BEVA dielectric layer 204l and an upper BEVA dielectric layer 204u overlying the lower BEVA dielectric layer 204l. Further, in some embodiments, the upper and lower BEVA dielectric layers 204u, 204l are different materials. The upper and lower BEVA dielectric layers 204u, 204l may each be or comprise, for example, silicon carbide, silicon nitride, some other dielectric, or any combination of the foregoing. In some embodiments, the upper BEVA dielectric layer 204u is silicon nitride, some other nitride, or some other dielectric, and/or the lower BEVA dielectric layer 204*l* is silicon carbide or some other dielectric.

The BEVA 106 extends through the BEVA dielectric layer 204 from the lower wire 114 to the memory cell 102. In some embodiments, a width W of the BEVA 106 is uniform or substantially uniform from the lower wire 114 to an interface between the upper and lower BEVA dielectric layers 204*u*, 204*l*. Further, in some embodiments, the width W of the BEVA 106 increases continuously from the interface to the top surface 106*t* of the BEVA 106. The top surface 106*t* of the BEVA 106 supports the memory cell 102. Further, the top surface 106*t* of the BEVA 106 is homogeneous, and flat or substantially flat. As noted above, this results in a uniform or substantially uniform electric field across the memory cell 102.

The memory cell 102 reversibly changes between a first data state and a second data state depending upon a voltage applied across the memory cell 102. In some embodiments, the memory cell 102 is a RRAM cell, a MRAM cell, or some other type of memory cell. In some embodiments where the memory cell 102 is an RRAM cell, the data storage element 110 of the memory cell 102 is normally insulating. However, the data storage element 110 can be made to conduct through conductive filaments 110*f* formed by application of an appropriate voltage across the memory cell 102. For ease of illustration, only one of the conductive filaments 110*f* is labeled 110*f*. Once the conductive filaments 110*f* are formed, the conductive filaments 110*f* may be reset (e.g., broken, resulting in a high resistance) or set (e.g., re-formed, resulting in a lower resistance) by application of an appropriate voltage across the memory cell 102. The low and high resistances may be used to indicate a digital signal (i.e., "1" or "0"), thereby allowing for data storage.

A hard mask 206 overlies the memory cell 102, and a spacer 208 overlies the data storage element 110 of the memory cell 102. The spacer 208 comprises a pair of segments respectively bordering opposite sidewalls of the top electrode 112 of the memory cell 102. In some embodiments, the segments respectively border opposite sidewalls of the hard mask 206 that are respectively aligned with the opposite sidewalls of the top electrode 112. In some embodiments, the spacer 208 extends laterally along sidewalls of the top electrode 112 in a closed path to completely enclose the top electrode 112. Note that this is not visible within the cross-sectional view 200A of FIG. 2A. In some embodiments, the spacer 208 is sunken into a top surface of the data storage element 110 (e.g., due to over etching). The hard mask 206 and the spacer 208 may each be or comprise, for example, silicon nitride, silicon oxide, silicon oxynitride, some other dielectric, or any combination of the foregoing.

A capping layer 210 lines sidewalls of the memory cell 102 and sidewalls of the spacer 208, and further overlies the hard mask 206 and the BEVA dielectric layer 204. Further, a device ILD layer 212 overlies the capping layer 210 and the BEVA dielectric layer 204. The capping layer 210 may be or comprise, for example, silicon oxide, some other oxide, or some other dielectric. The device ILD layer 212 may be or comprise, for example, silicon dioxide, a low κ dielectric, silicon nitride, some other dielectric, or any combination of the foregoing.

The upper wire 118 overlies the memory cell 102 and device ILD layer 212, within an upper ILD layer 214. The upper ILD layer 214 may be or comprise, for example, silicon dioxide, a low κ dielectric, silicon nitride, some other dielectric, or any combination of the foregoing. In some embodiments, the upper wire 118 comprises an upper wire body 118*b* and an upper wire liner 118*l*. The upper wire body 118*b* may be or comprise, for example, aluminum copper, copper, aluminum, some other metal, or some other conductive material. The upper wire liner 118*l* cups an underside of the upper wire body 118*b* so as to line a bottom surface of the upper wire body 118*b* and sidewalls of the upper wire body 118*b*. Further, the upper wire liner 118*l* blocks material from the upper wire body 118*b* from migrating (e.g., diffusing) out of the upper wire body 118*b*, and may be or comprise, for example, tantalum, titanium, titanium nitride, tantalum nitride, or some other barrier material for the upper wire body 118*b*.

The TEVA 120 is in the device ILD layer 212 and extends from the upper wire 118, through the device ILD layer 212, to the memory cell 102. In some embodiments, the TEVA 120 extends through the capping layer 210 and the hard mask 206, and/or is sunken into a top of the top electrode 112 of the memory cell 102. The TEVA 120 comprises a TEVA body 120*b* and a TEVA liner 120*l*. The TEVA liner 120*l* cups an underside of the TEVA body 120*b* and blocks material of the TEVA body 120*b* from migrating out of the TEVA 120.

Figure 2B:
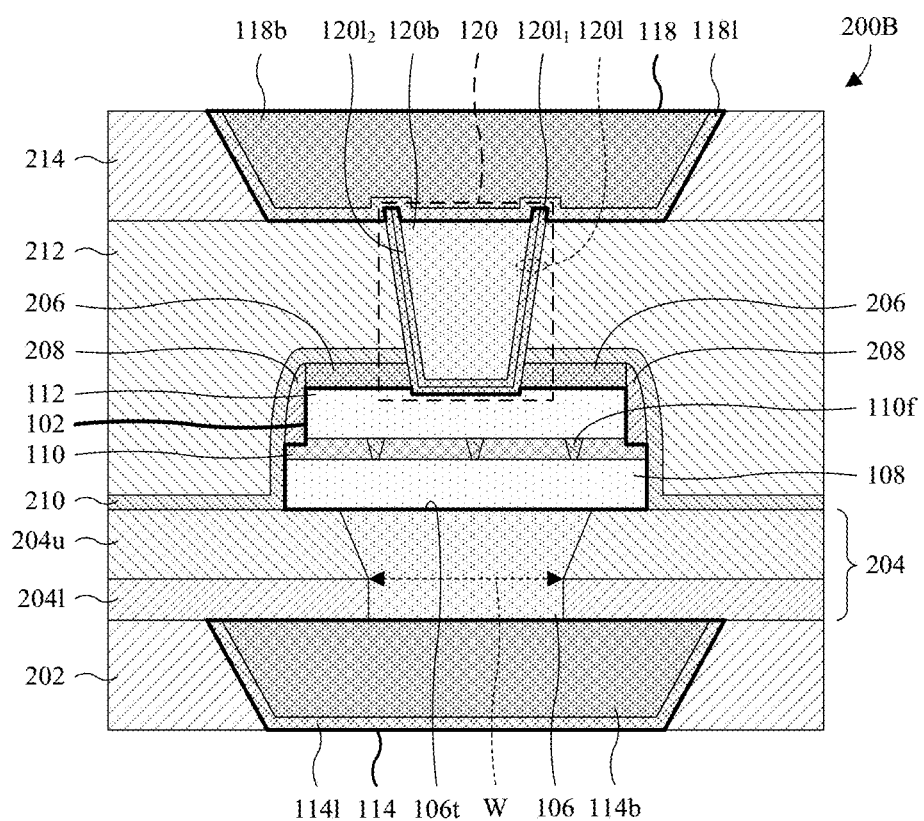

With reference to FIG. 2B, another cross-sectional view 200B of some more detailed embodiments of the IC of FIG. 1 is provided. FIG. 2B is a variant of FIG. 2A in which the TEVA liner 120*l* comprises a getter liner 120*l*$_1$ and a resistant liner 120*l*$_2$. The getter liner 120*l*$_1$ comprises a getter material that absorbs errant matter that may damage (e.g., oxidize) and negatively affect (e.g., increase contact resistance of) the top electrode 112 of the memory cell 102. The errant matter may be or comprise, for example, hydrogen gas, oxygen gas, water vapor, nitrogen gas, some other errant matter, or any combination of the foregoing, and/or the getter material may be or comprise, for example, titanium, zirconium, hafnium, lanthanum, palladium, palladium silver, palladium ruthenium, or any combination of the foregoing.

In some embodiments, the getter material has a higher affinity for the errant matter than an electrode material of the top electrode 112. For example, the getter material may have a higher reactivity with oxygen (e.g., requires less energy to react with oxygen) than the electrode material of the top electrode 112. The electrode material may be or comprise, for example, tantalum or some other conductive material, and/or the getter material may be or comprise, for example, hafnium, titanium, zirconium, lanthanum, or some other conductive material. Further, in some embodiments, the getter liner 120*l*$_1$ comprises errant matter absorbed by the getter material, and/or at least about 50%, about 60%, about 70%, about 80%, or about 90% of a total mass of the getter liner 120*l*$_1$ is the getter material.

The resistant liner 120*l*$_2$ overlies the getter liner 120*l*$_1$, between the getter liner 120*l*$_1$ and the TEVA body 120*b*. The resistant liner 120*l*$_2$ is resistant to corrosion or damage by the errant matter, and protects the top electrode 112 from the errant matter. The resistant liner 120*l*$_2$ may be or comprise, for example, titanium nitride, tantalum nitride, nickel, tungsten, copper, gold, ruthenium, platinum, some other conductive material, or any combination of the foregoing. In some embodiments, the resistant liner 120*l*$_2$ is or comprises a resistant material with a lower affinity for the errant matter than the getter material and the electrode material. For example, the resistant material may have a lower reactivity with oxygen (e.g., requires more energy to react with oxygen) than the getter material and/or the electrode material. The resistant material may be or comprise, for example, titanium nitride or some other conductive material, the getter material may be or comprise, for example, titanium or some other conductive material, and the electrode material may be or comprise, for example, tantalum or some other conductive material.

The getter liner $120l_1$ and the resistant liner $120l_2$ protect the top electrode 112 from the errant matter during formation of the IC and during use of the IC. The resistant liner $120l_2$ blocks the errant matter from reaching the top electrode 112. The getter liner $120l_1$ absorbs residual errant matter on the top electrode 112, and/or errant matter that finds its way past the getter liner $120l_1$. By protecting the top electrode 112 from the errant matter, the top electrode 112 is free of corrosion and damage from the errant matter. As a result, the top electrode 112 has a low contact resistance and the memory cell 102 operates reliably.

Figure 3:
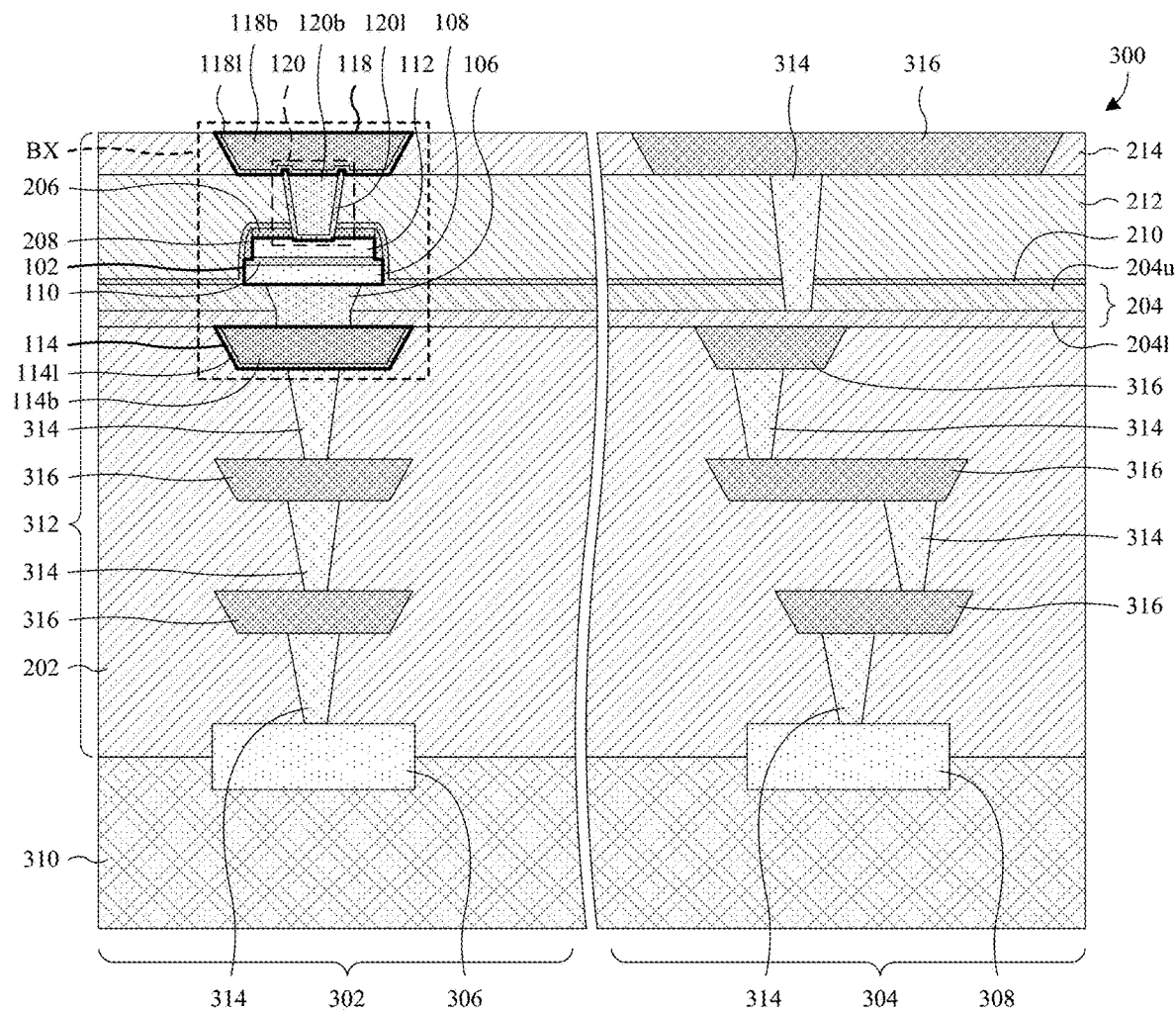
FIG. 3 illustrates an expanded cross-sectional view of some embodiments of the IC of FIG. 2A or 2B.

With reference to FIG. 3, an expanded cross-sectional view 300 of some embodiments of the IC of FIG. 2A or 2B is provided. The cross-sectional view 200A of FIGS. 2A and 2B may, for example, be taken within box BX. As illustrated, the IC includes a memory region 302 and a logic region 304. The memory region 302 accommodates the memory cell 102. The memory cell 102 rests on the BEVA 106 and underlies the TEVA 120. Further, the BEVA 106 has a top surface that is homogeneous (e.g., a single material), and that is flat or substantially flat, so as to produce a uniform electric field across the memory cell 102.

In some embodiments, the memory cell 102 is one of many memory cells defining a memory cell array (not labeled) in the memory region 302. In some embodiments, each memory cell of the memory cell array is as the memory cell 102 is shown and described with respect to FIG. 1, FIG. 2A, FIG. 2B, or any combination of the foregoing. In some embodiments, each memory cell of the memory cell array rests on a BEVA and underlies a TEVA. Each TEVA of the memory cell array may, for example, be as the TEVA 120 is shown and described with respect to FIG. 1, FIG. 2A, FIG. 2B, or any combination of the foregoing. Each BEVA of the memory cell array may, for example, be as the BEVA 106 is shown and described with respect to FIG. 1, FIG. 2A, FIG. 2B, or any combination of the foregoing so as to produce a uniform or substantially uniform electric field across a corresponding memory cell. In some embodiments, each memory cell of the memory cell array overlies and is electrically coupled to an access device 306. The access device 306 facilitates access or selection of a corresponding memory cell in the memory cell array and may be, for example, an insulated gate field-effect transistor (IGFET), a metal-oxide-semiconductor field-effect transistor (MOSFET), or some other type of semiconductor device.

The logic region 304 accommodates a logic device 308. The logic device 308 may be or comprise, for example, an IGFET, a MOFSET, or some other type of semiconductor device. In some embodiments, the logic device 308 is one of many logic devices defining a logic core (not labeled). In some of such embodiments, operation of the logic core is supported or aided by the memory cell array, and/or the memory cell array is embedded memory. Further, in some embodiments, the logic device 308 supports operation of the memory cell 102 and/or the memory cell array. For example, the logic device 308 may facilitate reading and/or writing data of to the memory cell 102 and/or the memory cell array.

In addition to the memory cell 102 and the logic device 308, the IC further comprises a semiconductor substrate 310 and a BEOL interconnect structure 312. The semiconductor substrate 310 supports and partially defines the logic device 308 and, in some embodiments, the access device 306. In some embodiments, the semiconductor substrate 310 further supports and partially defines a logic core that includes the logic device 308. The semiconductor substrate 310 may be, for example, a bulk silicon substrate, a silicon-on-insulator (SOI) substrate, or some other type of semiconductor substrate. The BEOL interconnect structure 312 overlies the semiconductor substrate 310 and accommodates the memory cell 102. In some embodiments, the BEOL interconnect structure 312 further overlies and accommodates a memory cell array that includes the memory cell 102. The BEOL interconnect structure 312 comprises a dielectric stack and a plurality of conductive features.

The dielectric stack comprises a lower ILD layer 202 covering the semiconductor substrate 310 and the logic device 308. In some embodiments, the lower ILD layer 202 further covers the access device 306. The dielectric stack further comprises a BEVA dielectric layer 204 covering the lower ILD layer 202, a device ILD layer 212 covering the BEVA dielectric layer 204, and an upper ILD layer 214 covering the device ILD layer 212.

The conductive features are stacked in the dielectric stack to define conductive paths interconnecting the memory cell 102b, the logic device 308, and other devices of the IC (e.g., the access device 306). The conductive features include the lower wire 114, the upper wire 118, the BEVA 106, and the TEVA 120. Further, the conductive features include a plurality of additional vias 314 and a plurality of additional wires 316. The additional vias 314 and the additional wires 316 may be or comprise, for example, tungsten, copper, aluminum copper, aluminum, some other conductive material, or any combination of the foregoing.

With reference to FIGS. 4-14, 15A, 15B, 16, and 17, a series of cross-sectional views 400-1400, 1500A, 1500B, 1600, 1700 of some embodiments of a method for forming an IC comprising a memory cell on a homogeneous BEVA top surface is provided. The IC may be, for example, the IC of FIG. 2A or 2B, and FIGS. 15A and 15B illustrate a step of the method respectively for FIG. 2A and FIG. 2B.

Figure 4:
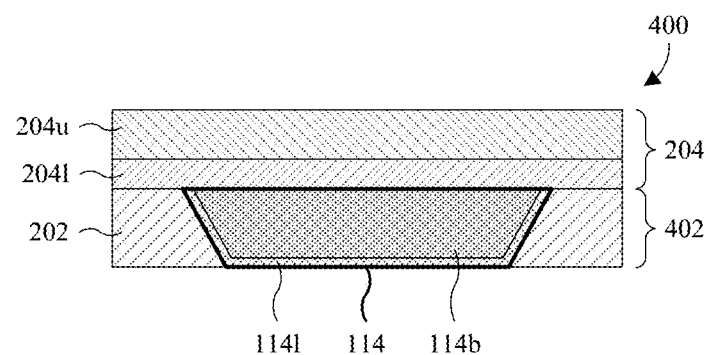
FIGS. 4-14, 15A, 15B, 16, and 17 illustrate a series of cross-sectional views of some embodiments of a method for forming an IC comprising a memory cell on a homogeneous BEVA top surface.

As illustrated by the cross-sectional view 400 of FIG. 4, a substrate 402 is provided or formed. The substrate 402 comprises a lower ILD layer 202 and a lower wire 114. Further, in some embodiments, the substrate 402 comprises the semiconductor substrate 310 of FIG. 3, a portion of the interconnect structure 312 of FIG. 3 that is below the BEVA dielectric layer 204, the access device 306 of FIG. 3, the logic device 308 of FIG. 3, or any combination of the foregoing. The lower ILD layer 202 may be or comprise, for example, silicon nitride, silicon oxide, a low κ dielectric layer, some other dielectric, or any combination of the foregoing. The lower wire 114 is recessed into a top of the lower ILD layer 202, such that a top surface of the lower wire 114 is even or substantially even with a top surface of the lower ILD layer 202. The lower wire 114 may be or comprise, for example, titanium nitride, tantalum, tantalum nitride, titanium, aluminum, aluminum copper, copper, some other conductive material, or any combination of the foregoing. In some embodiments, the lower wire 114 is heterogeneous (e.g., multiple materials) and comprises a lower wire body 114b and a lower wire liner 114l. The lower wire body 114b may be or comprise, for example, copper, aluminum copper, aluminum, or some other conductive material. The lower wire liner 114l cups an underside of the lower wire body 114b and blocks material of the lower wire body 114b from migrating to surrounding structure. The lower wire liner 114l may be or comprise, for example, titanium, tantalum, titanium nitride, tantalum nitride, or some other barrier material for the lower wire body 114b.

Also illustrated by the cross-sectional view 400 of FIG. 4, a BEVA dielectric layer 204 is formed covering the substrate 402. The BEVA dielectric layer 204 may be or comprise, for example, silicon carbide, silicon nitride, silicon oxide, silicon oxynitride, some other dielectric, or any combination of the foregoing. In some embodiments, the BEVA dielectric layer 204 comprises a lower BEVA dielectric layer 204*l* and an upper BEVA dielectric layer 204*u* covering the lower BEVA dielectric layer 204*l*. The lower BEVA dielectric layer 204*l* may be or comprise, for example, silicon carbide or some other dielectric, and/or the upper BEVA dielectric layer 204*u* may be or comprise, for example, silicon nitride or some other dielectric. In some embodiments, a process for forming the BEVA dielectric layer 204 comprises chemical vapor deposition (CVD), physical vapor deposition (PVD), some other deposition process, or any combination of the foregoing.

Figure 5:
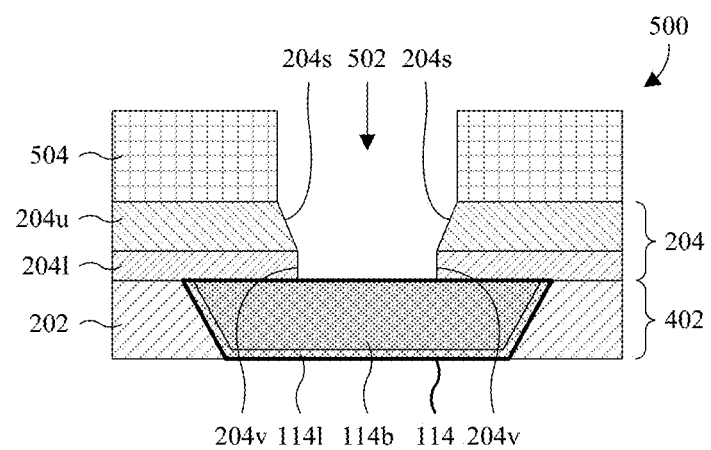

As illustrated by the cross-sectional view 500 of FIG. 5, a first etch is performed into the BEVA dielectric layer 204 to form a BEVA opening 502 overlying and exposing the lower wire 114. In some embodiments, upon completion of the first etch, the upper BEVA dielectric layer 204*u* has a pair of slanted sidewalls 204*s* in the BEVA opening 502 and respectively on opposite sides of the BEVA opening 502, whereas the lower BEVA dielectric layer 204*l* has a pair of vertical or substantially vertical sidewalls 204*v* in the BEVA opening 502 and respectively on the opposite sides.

In some embodiments, a process for performing the first etch comprises forming a photoresist mask 504 on the BEVA dielectric layer 204. The photoresist mask 504 may, for example, be formed by depositing a photoresist layer on the BEVA dielectric layer 204 and patterning the photoresist layer with a layout of the BEVA opening 502. The depositing may, for example, be performed by spin coating or some other deposition process, and/or the patterning may, for example, be performed by photolithography or some other patterning process. One or more first etchants are applied to the upper BEVA dielectric layer 204*u* until the lower BEVA dielectric layer 204*l* is reached by the first etchant(s) to partially form the BEVA opening 502. One or more second etchants are applied to the lower BEVA dielectric layer 204*l*, through the BEVA opening 502 as partially formed, until the lower wire 114 is reached by the second etchant(s) to finish forming the BEVA opening 502. The photoresist mask 504 is thereafter removed.

Figure 6:
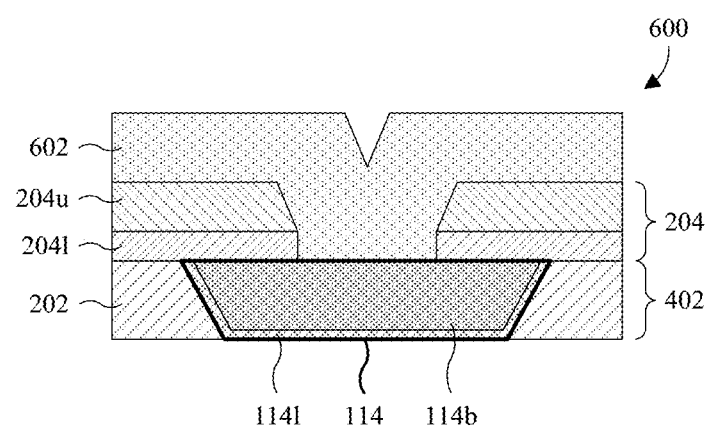

As illustrated by the cross-sectional view 600 of FIG. 6, a BEVA layer 602 is formed covering the BEVA dielectric layer 204 and further filling the BEVA opening 502 (see FIG. 5). The BEVA layer 602 is conductive and homogeneous (e.g., a single material). The BEVA layer 602 may be or comprise, for example, titanium nitride, tungsten, titanium, or some other conductive material. Further, the BEVA layer 602 may be formed by, for example, CVD, PVD, sputtering, electroless plating, electroplating, or some other plating or deposition process.

Figure 7:
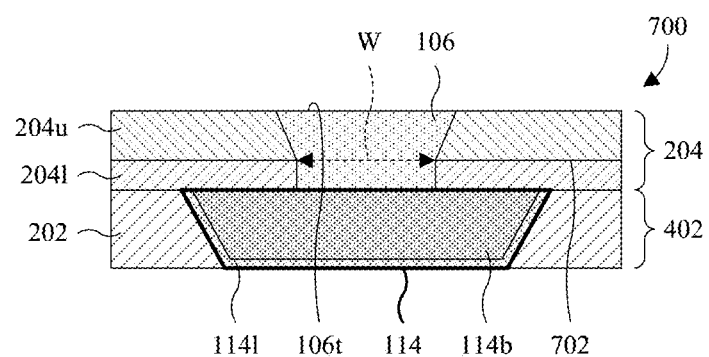

As illustrated by the cross-sectional view 700 of FIG. 7, a first planarization is performed into a top of the BEVA layer 602 (see FIG. 6), until the BEVA dielectric layer 204 is reached, to form a BEVA 106 in the BEVA opening 502 (see FIG. 5). The BEVA 106 is formed with a top surface 106*t* that is homogeneous because the BEVA layer 602 is homogenous. Further, because the BEVA layer 602 is homogenous and, hence, does not have multiple material hardnesses, the BEVA layer 602 does not have multiple removal rates during the planarization. Accordingly, the first planarization uniformly or substantially uniformly removes material of the BEVA layer 602 to form the BEVA 106 so the top surface 106*t* of the BEVA 106 is flat or substantially flat. Because the top surface 106*t* of the BEVA 106 is flat or substantially flat, the electric field across a memory cell subsequently formed on the BEVA 106 is uniform or substantially uniform. In some embodiments, the BEVA 106 is formed with a width W that is uniform or substantially uniform from the lower wire 114 to an interface 702 between the upper and lower BEVA dielectric layers 204*u*, 204*l*, and that increases continuously from the interface 702 to the top surface 106*t* of the BEVA 106. The first planarization may, for example, be performed by a chemical mechanical polish (CMP) or some other planarization process.

Figure 8:
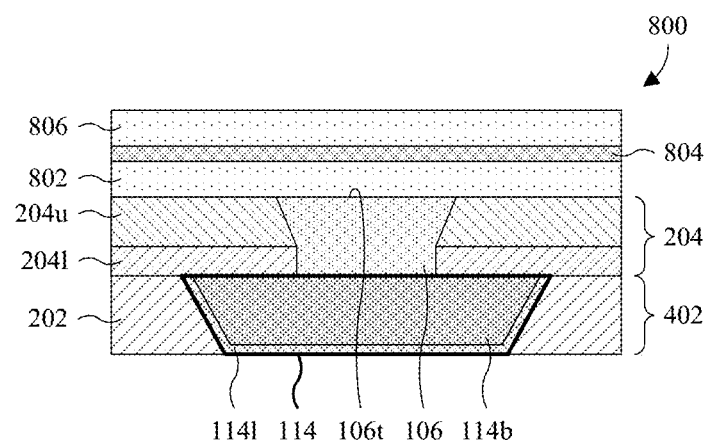

As illustrated by the cross-sectional view 800 of FIG. 8, a bottom electrode layer 802, a data storage layer 804, and a top electrode layer 806 are formed on the BEVA 106 and the BEVA dielectric layer 204. The bottom electrode layer 802 is formed covering the BEVA dielectric layer 204 and the BEVA 106. The data storage layer 804 is formed covering the bottom electrode layer 802. The top electrode layer 806 is formed covering the data storage layer 804. The bottom and top electrode layers 802, 806 are conductive and may be or comprise, for example, metals, metal nitrides, or some other conductive materials. The data storage layer 804 reversibly changes between a first data state (e.g., a first resistance) and a second data state (e.g., a second resistance) depending upon a voltage applied across the data storage layer 804. In some embodiments where the memory cell under manufacture is an RRAM cell, the data storage layer 804 may be or comprise, for example, hafnium oxide, some other high κ dielectric, or some other dielectric. In some embodiments where the memory cell under manufacture is an MRAM cell, the data storage layer 804 may be or comprise, for example, a MTJ layer or some other magnetic storage layer. The MTJ layer may, for example, comprise a first ferromagnetic layer, an insulating layer overlying the first ferromagnetic layer, and a second ferromagnetic layer overlying the insulating layer. In some embodiments, the bottom and top electrode layers 802, 806 and the data storage layer 804 are formed by CVD, PVD, electroless plating, electroplating, sputtering, some other plating or deposition process, or any combination of the foregoing.

Figure 9:
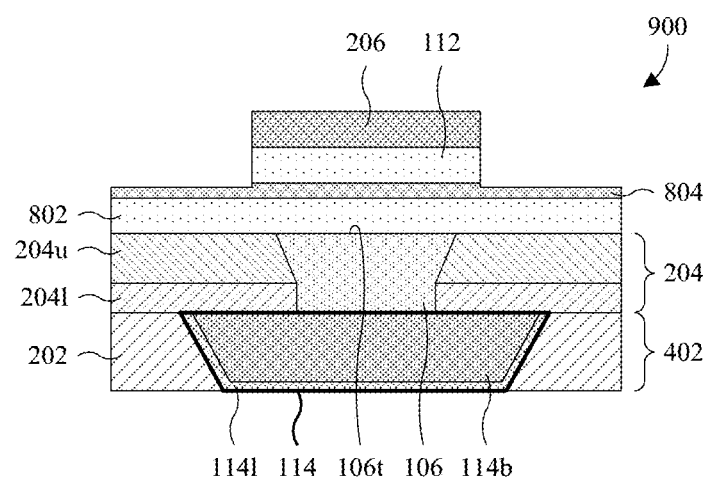

As illustrated by the cross-sectional view 900 of FIG. 9, a hard mask 206 is formed covering a memory cell region of the top electrode layer 806 (see FIG. 8) that overlies the BEVA 106. The hard mask 206 may be or comprise, for example, silicon nitride, some other nitride, some other dielectric, or any combination of the foregoing. Further, the hard mask 206 may, for example, be formed by depositing a hard mask layer on the top electrode layer 806 and patterning the hard mask layer into the hard mask 206. The depositing may, for example, be performed by CVD, PVD, or some other deposition process, and/or the patterning may, for example, be performed by using photolithography and an etching process.

Also illustrated by the cross-sectional view 900 of FIG. 9, a second etch is performed into the top electrode layer 806 (see FIG. 8) with the hard mask 206 in place to form a top electrode 112 underlying the hard mask 206. In some embodiments, the data storage layer 804 serves as an etch stop for the second etch and/or the second etch over extends into the data storage layer 804 to partially etch the data storage layer 804.

Figure 10:
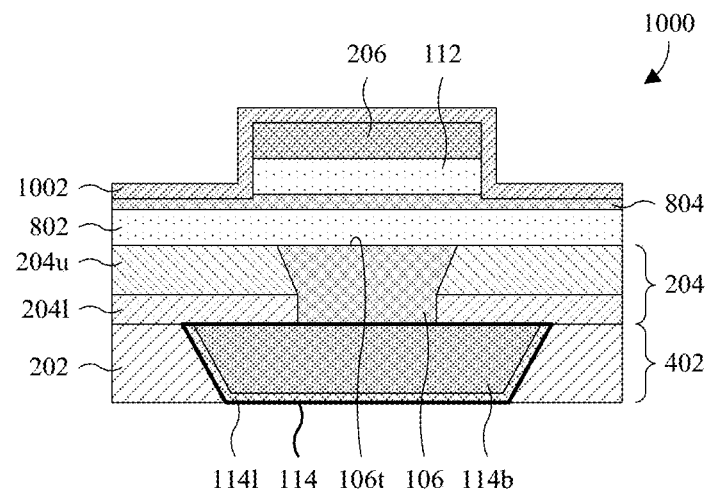

As illustrated by the cross-sectional view 1000 of FIG. 10, a spacer layer 1002 is formed covering and lining the structure of FIG. 9. In some embodiments, the spacer layer 1002 is formed conformally, and/or is formed by CVD, PVD, or some other deposition process. The spacer layer 1002 may be or comprise, for example, silicon nitride, silicon oxide, silicon oxynitride, some other dielectric, or any combination of the foregoing.

Figure 11:
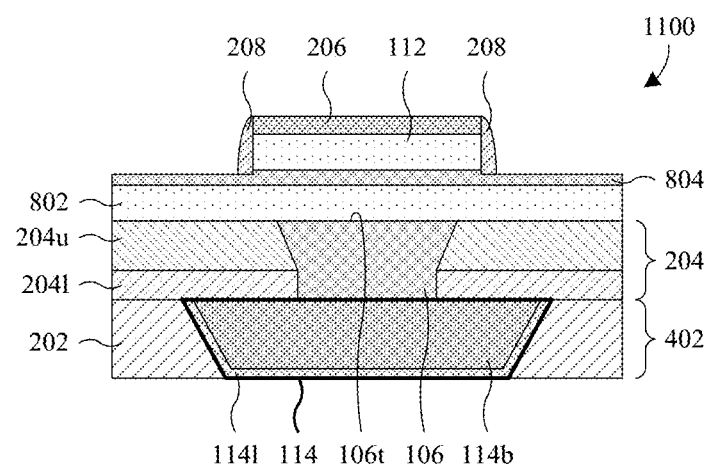

As illustrated by the cross-sectional view 1100 of FIG. 11, a third etch is performed into the spacer layer 1002 (see FIG. 10) to etch back the spacer layer 1002 and to form a spacer 208 from the spacer layer 1002. The spacer 208 comprises a pair of segments respectively on opposite sidewalls of the top electrode 112. Further, in some embodiments, the segments are respectively on opposite sidewalls of the hard mask 206, and/or the opposite sidewalls of the hard mask 206 are respectively even with the opposite sidewalls of the top electrode 112. In some embodiments, the spacer 208 extends laterally along sidewalls of the top electrode 112 in a closed path to completely enclose the top electrode 112. Note that this is not visible within the cross-sectional view 1100 of FIG. 11. A process for performing the third etch may comprise, for example, applying one or more etchants to the spacer layer 1002 to remove horizontal segments of the spacer layer 1002 without removing vertical segments of the spacer layer 1002.

Figure 12:
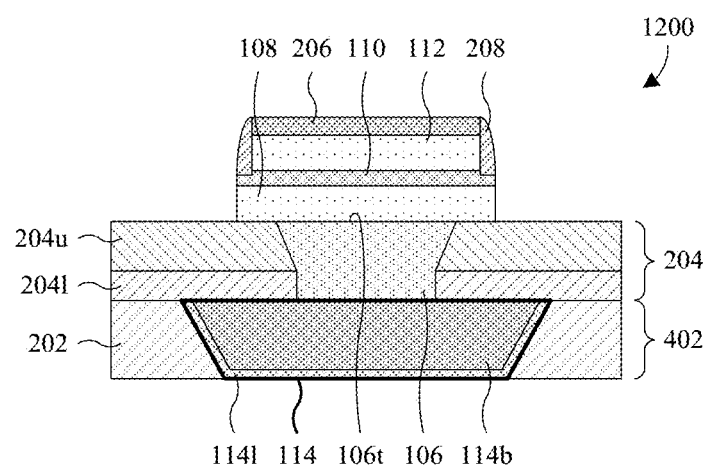

As illustrated by the cross-sectional view 1200 of FIG. 12, a fourth etch is performed into the data storage layer 804 (see FIG. 11) and the bottom electrode layer 802 (see FIG. 11) with the spacer 208 and the hard mask 206 in place to form a data storage element 110 and a bottom electrode 108. The data storage element 110 underlies the top electrode 112, and the bottom electrode 108 underlies the data storage element 110. A process for performing the fourth etch may comprise, for example, applying one or more etchants to the data storage layer 804 and the bottom electrode layer 802 until the BEVA dielectric layer 204 is reached by the etchant(s).

Figure 13:
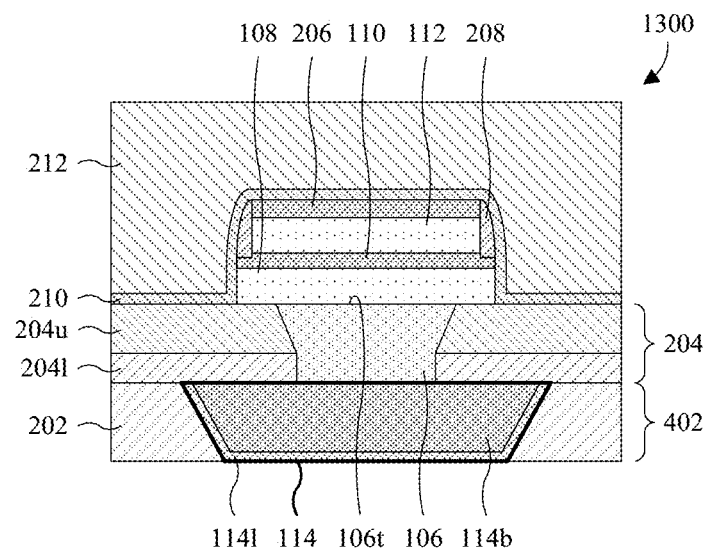

As illustrated by the cross-sectional view 1300 of FIG. 13, a capping layer 210 is formed covering the BEVA dielectric layer 204, the spacer 208, and the hard mask 206. Further, the capping layer 210 is formed lining sidewalls of the spacer 208, sidewalls of the data storage element 110, and sidewalls of the bottom electrode 108. The capping layer 210 may be or comprise, for example, silicon nitride, some other nitride, or some other dielectric. In some embodiments, the capping layer 210 is formed by conformal deposition, and/or is formed by CVD, PVD, or some other deposition process.

Also illustrated by the cross-sectional view 1300 of FIG. 13, a device ILD layer 212 is formed covering the capping layer 210. Further, the device ILD layer 212 is formed with a top surface that is planar or substantially planar. The device ILD layer 212 may be or comprise, for example, silicon oxide, a low κ dielectric, some other dielectric layer, or any combination of the foregoing. In some embodiments, a process for forming the device ILD layer 212 comprises depositing the device ILD layer 212 covering the capping layer 210, and subsequently performing a planarization into a top of the device ILD layer 212. The device ILD layer 212 may, for example, be deposited by CVD, PVD, sputtering, some other deposition process, or any combination of the foregoing. The planarization may, for example, be performed by a CMP or some other planarization process.

Figure 14:
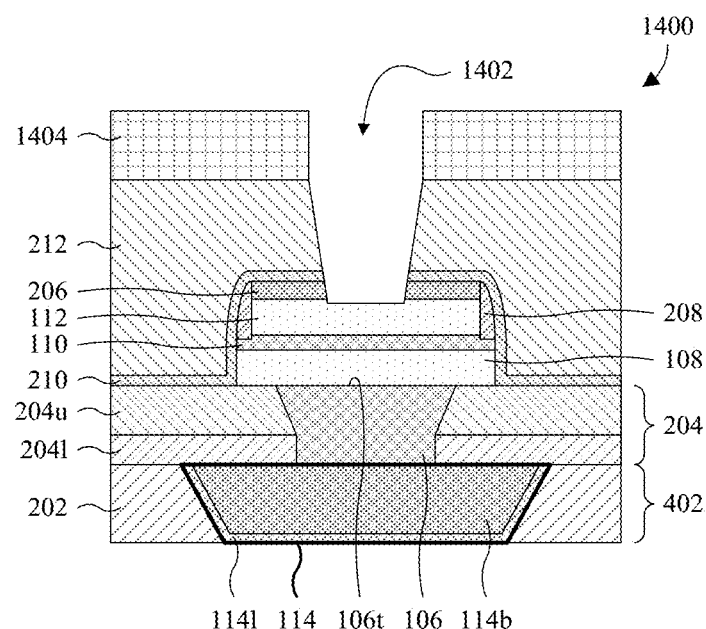

As illustrated by the cross-sectional view 1400 of FIG. 14, a fifth etch is performed into the device ILD layer 212, the capping layer 210, and the hard mask 206 to form a TEVA opening 1402 overlying and exposing the top electrode 112. In some embodiments, a process for performing the fifth etch comprises forming a photoresist mask 1404 on the device ILD layer 212. The photoresist mask 1404 may, for example, be formed by depositing a photoresist layer on the device ILD layer 212 and patterning the photoresist layer with a layout of the TEVA opening 1402. The depositing may, for example, be performed by spin coating or some other deposition process, and/or the patterning may, for example, be performed by photolithography. One or more etchants are then be applied to the device ILD layer 212, the capping layer 210, and the hard mask 206 with the photoresist mask 1404 in place, and the photoresist mask 1404 is thereafter removed.

Figure 15A:
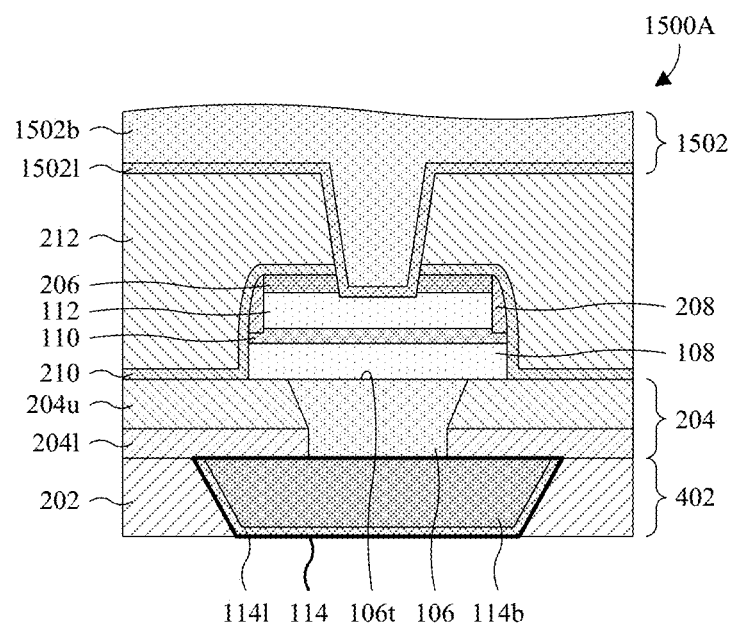

As illustrated by the cross-sectional view 1500A of FIG. 15A, a TEVA layer 1502 is formed covering the device ILD layer 212 and filling the TEVA opening 1402 (see FIG. 14). The TEVA layer 1502 comprises a TEVA liner layer 1502$l$ and a TEVA body layer 1502$b$. The TEVA liner layer 1502$l$ covers the device ILD layer 212 and lines (e.g., conformally lines) the TEVA opening 1402. The TEVA body layer 1502$b$ covers the TEVA liner layer 1502$l$ and fills the TEVA opening 1402 over the TEVA liner layer 1502$l$. The TEVA liner layer 1502$l$ is a different material than the TEVA body layer 1502$b$ and has a different hardness than the TEVA body layer 1502$b$. Further, the TEVA liner layer 1502$l$ blocks material of the TEVA body layer 1502$b$ from migrating to surrounding structure. The TEVA body layer 1502$b$ may be or comprise, for example, tungsten, copper, aluminum copper, aluminum, some other metal, or some other conductive material. The TEVA liner layer 1502$l$ may be or comprise, for example, titanium, tantalum, titanium nitride, tantalum nitride, or some other barrier material for the TEVA body layer 1502$b$. The TEVA liner layer 1502$l$ and the TEVA body layer 1502$b$ may, for example, be formed by CVD, PVD, electroless plating, electroplating, some other plating or deposition process, or any combination of the foregoing.

In some embodiments, etch residue from the fifth etch remains on the top electrode 112 upon completion of the fifth etch. Such etch residue may, for example, include errant matter that may corrode or damage the top electrode 112. Further, in some embodiments, the top electrode 112 is exposed to errant matter that may corrode or damage the top electrode 112 through the TEVA opening 1402. For example, errant gases in an ambient environment of the IC may interact with the top electrode 112 through the TEVA opening 1402 (see FIG. 14). Accordingly, in some embodiments, a cleaning process is performed on the top electrode 112 before (e.g., immediately before) the TEVA layer 1502 is formed to remove errant matter on the top electrode 112, and/or to remove corrosion or damage to the top electrode 112.

Figure 15B:
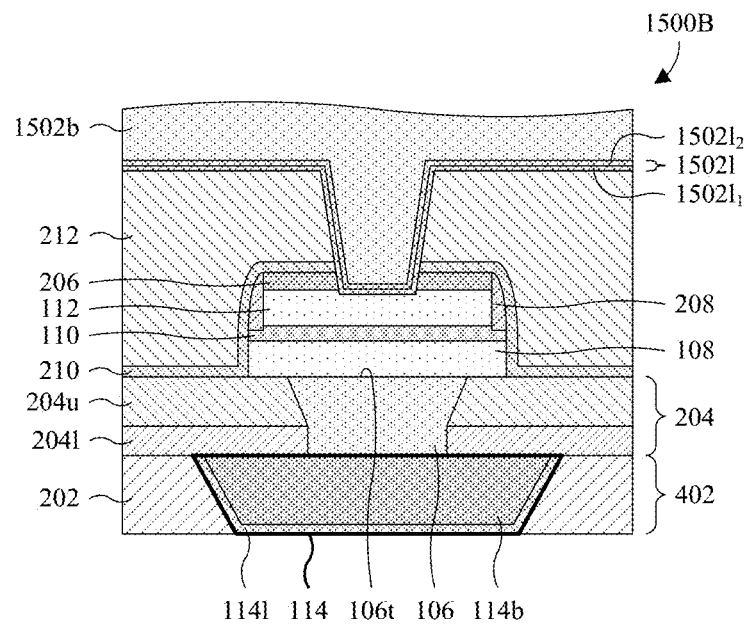

As illustrated by the cross-sectional view 1500B of FIG. 15B, a variant of FIG. 15A is provided in which the TEVA liner layer 1502$l$ is formed with a getter liner layer 1502$l_1$ and a resistant liner layer 1502$l_2$. The getter liner layer 1502$l_1$ comprises a getter material that absorbs errant matter that may damage (e.g., oxidize) and negatively affect (e.g., increase contact resistance) the top electrode 112. The errant matter may be or comprise, for example, residual etch residue comprising oxygen, oxygen gas, water vapor, or some other errant matter, and/or the getter material may be or comprise, for example, titanium, zirconium, hafnium, lanthanum, palladium, palladium silver, palladium ruthenium, or any combination of the foregoing. In some embodiments, the getter material may have a higher reactivity with oxygen (e.g., requires less energy to react with oxygen) than an electrode material of the top electrode 112. Further, in some embodiments, the getter liner layer 1502$l_1$ comprises errant matter absorbed by the getter material, and/or at least about 50%, about 60%, about 70%, about 80%, or about 90% of a total mass of the getter liner layer 1502$l_1$ is the getter material.

The resistant liner layer 1502$l_2$ overlies the getter liner layer 1502$l_1$, between the getter liner layer 1502$l_1$ and the TEVA body layer 1502$b$. The resistant liner layer 1502$l_2$ is resistant to corrosion and damage by the errant matter, and protects the top electrode 112 from the errant matter. The resistant liner layer 1502$l_2$ may be or comprise, for example, titanium nitride, tantalum nitride, nickel, tungsten, copper, gold, ruthenium, platinum, some other conductive material, or any combination of the foregoing. In some embodiments, the resistant liner layer 1502$l_2$ has a lower reactivity with oxygen (e.g., requires more energy to react with oxygen) than the getter material and/or the electrode material.

The getter liner layer 1502$l_1$ and the resistant liner layer 1502$l_2$ protect the top electrode 112 from the errant matter during formation of the IC and during use of the IC. The resistant liner layer 1502$l_2$ blocks the errant matter from reaching the top electrode 112. The getter liner layer 1502$l_1$ absorbs residual errant matter on the top electrode 112, and/or errant matter that finds its way past the resistant liner layer 1502$l_2$. By protecting the top electrode 112 from the errant matter, the top electrode 112 is free of damage from the errant matter. As a result, the top electrode 112 has a low contact resistance and the IC has high reliability.

Figure 16:
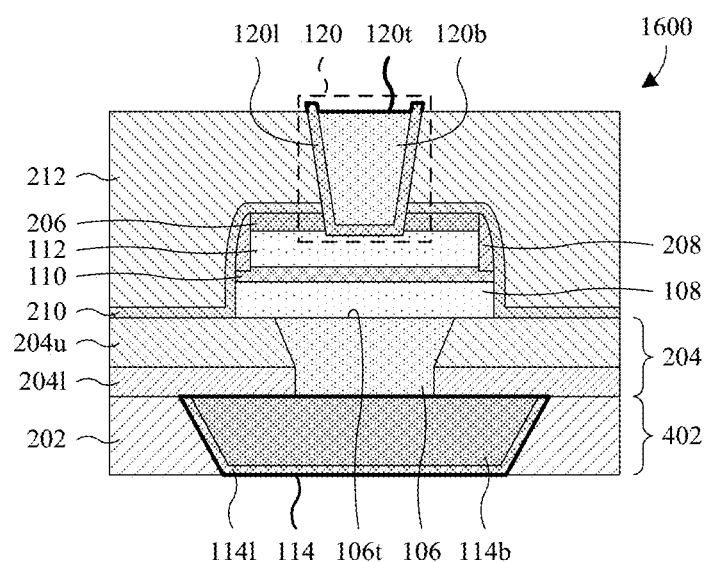

As illustrated by the cross-sectional view 1600 of FIG. 16, a second planarization is performed into a top of TEVA layer 1502 (see FIG. 15A or FIG. 15B), including a top of the TEVA liner layer 1502$l$ (see FIG. 15A or FIG. 15B) and a top of the TEVA body layer 1502$b$ (see FIG. 15A or FIG. 15B), until the device ILD layer 212 is reached to form a TEVA 120 in the TEVA opening 1402 (see FIG. 14). The TEVA 120 comprises a TEVA body 120$b$ and a TEVA liner 120$l$. The TEVA body 120$b$ is formed from the TEVA body layer 1502$b$, and the TEVA liner 120$l$ is formed from the TEVA liner layer 1502$l$. Further, the TEVA liner 120$l$ cups an underside of the TEVA body 120$b$ so as to line a bottom surface of the TEVA body 120$b$ and sidewalls of the TEVA body 120$b$. In some embodiments, the TEVA liner 120$l$ comprises a getter liner 120$l_1$ (not shown in FIG. 16, but shown in FIG. 2B) formed from the getter liner layer 1502$l_1$ (see FIG. 15B), and further comprises a resistant liner 120$l_2$ (not shown in FIG. 16, but shown in FIG. 2B) formed from the resistant liner layer 1502$l_2$ (see FIG. 15B). The second planarization may, for example, be performed by a CMP or some other planarization process.

Because the TEVA 120 is formed from both the TEVA liner layer 1502$l$ and the TEVA body layer 1502$b$, and because the TEVA liner layer 1502$l$ and the TEVA body layer 1502$b$ are different materials, the TEVA 120 is heterogeneous (e.g., multiple materials) and has a top surface 120$t$ that is heterogeneous. Further, because the TEVA liner layer 1502$l$ and the TEVA body layer 1502$b$ are different materials, the TEVA liner layer 1502$l$ and the TEVA body layer 1502$b$ have different hardnesses and, hence, different removal rates during the second planarization. Accordingly, the second planarization non-uniformly removes material from the TEVA liner layer 1502$l$ and the TEVA body layer 1502$b$. This, in turn, forms the TEVA 120 so the top surface 120$t$ of the TEVA 120 that is rough or uneven.

Figure 17:
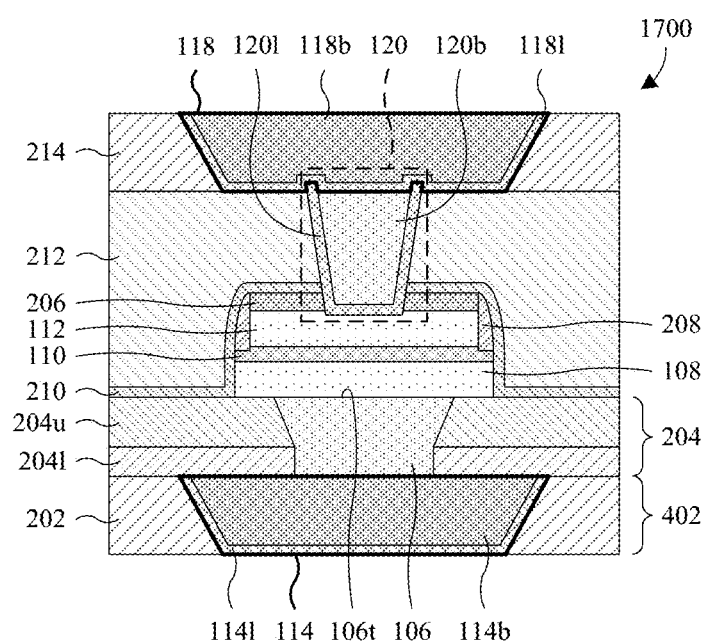

As illustrated by the cross-sectional view 1700 of FIG. 17, an upper ILD layer 214 and an upper wire 118 are formed on the device ILD layer 212 and the TEVA 120. The upper ILD layer 214 may be or comprise, for example, silicon nitride, silicon oxide, a low κ dielectric layer, some other dielectric, or any combination of the foregoing. The upper wire 118 is recessed into a bottom of the upper ILD layer 214, such that a bottom surface of the upper wire 118 is even or substantially even with a bottom surface of the upper ILD layer 214. Further, the upper wire 118 overlies and is electrically coupled to the TEVA 120. The upper wire 118 may be or comprise, for example, titanium nitride, tantalum, tantalum nitride, titanium, aluminum, aluminum copper, copper, some other conductive material, or any combination of the foregoing. In some embodiments, the upper wire 118 is heterogeneous (e.g., multiple materials) and comprises an upper wire body 118$b$ and an upper wire liner 118$l$. The upper wire body 118$b$ may be or comprise, for example, copper, aluminum copper, aluminum, or some other conductive material. The upper wire liner 118$l$ cups an underside of the upper wire body 118$b$ and blocks material of the upper wire body 118$b$ from migrating to surrounding structure. The upper wire liner 118$l$ may be, for example, titanium, tantalum, titanium nitride, tantalum nitride, or some other barrier material for the upper wire body 118$b$.

In some embodiments where the data storage element 110 corresponds to RRAM, a forming voltage is applied across the data storage element 110, from the bottom electrode 108 to the top electrode 112, to form one or more conductive filaments (not shown) in the data storage element 110. Examples of the conductive filament(s) are shown in FIGS. 2A and 2B (see the conductive filament(s) 110$f$ in FIGS. 2A and 2B).

Figure 18:
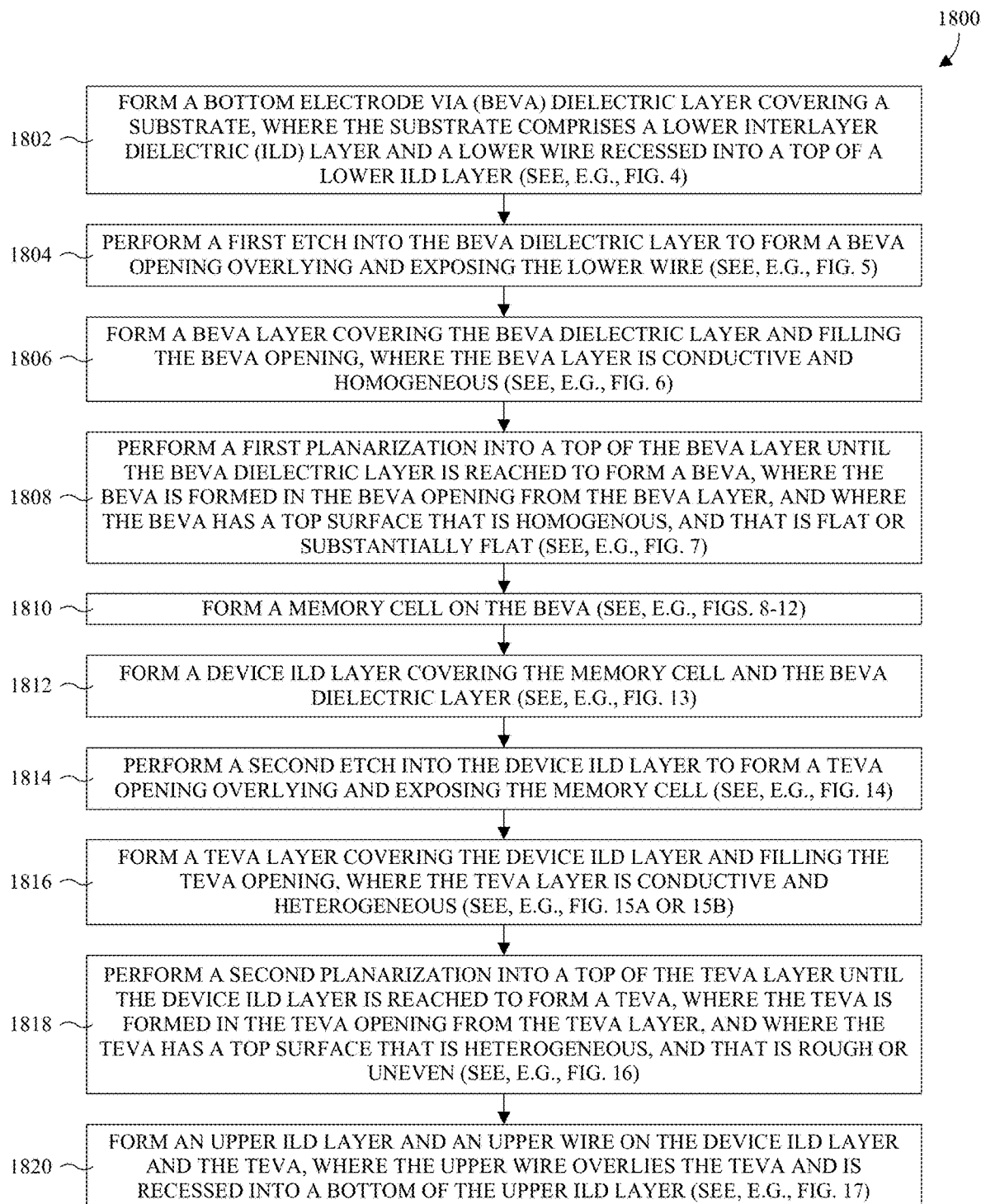
FIG. 18 illustrates a flowchart of some embodiments of the method of FIGS. 4-14, 15A, 15B, 16, and 17.

With reference to FIG. 18, a flowchart 1800 of some embodiments of method of FIGS. 4-17 is provided.

At 1802, a BEVA dielectric layer is formed covering a substrate. See, for example, FIG. 4. The substrate comprises a lower ILD layer and a lower wire. The lower wire is recessed into a top of a lower ILD layer, such that a top surface of the lower wire is even or substantially even with a top surface of the lower ILD layer. The lower ILD layer and the lower wire may, for example, be components of a BEOL interconnect structure.

At 1804, a first etch is performed into the BEVA dielectric layer to form a BEVA opening overlying and exposing the lower wire. See, for example, FIG. 5.

At 1806, a BEVA layer is formed covering the BEVA dielectric layer and filling the BEVA opening. See, for example, FIG. 6. The BEVA layer is conductive and homogeneous.

At 1808, a first planarization is performed into a top of the BEVA layer until the BEVA dielectric layer is reached to form a BEVA. See, for example, FIG. 7. The BEVA is formed in the BEVA opening from the BEVA layer. Further, the BEVA has a top surface that is homogenous, and that is flat or substantially flat. The top surface of the BEVA is flat or substantially flat because the BEVA layer is homogenous and is therefore removed at a uniform or substantially uniform rate during the first planarization. Because the top surface of the BEVA is flat or substantially flat, an electric field produced using the BEVA is uniform or substantially uniform.

At 1810, a memory cell is formed on the BEVA. See, for example, FIGS. 8-12. The memory cell may be, for example, an RRAM cell, a MRAM cell, or some other type of memory cell.

At 1812, a device ILD layer is formed covering the memory cell and the BEVA dielectric layer. See, for example, FIG. 13.

At 1814, a second etch is performed into the device ILD layer to form a TEVA opening overlying and exposing the memory cell. See, for example, FIG. 14.

At 1816, a TEVA layer is formed covering the device ILD layer and filling the TEVA opening. See, for example, FIG. 15A or 15B. The TEVA layer is conductive and heterogeneous.

At 1818, a second planarization is performed into a top of the TEVA layer until the device ILD layer is reached to form a TEVA. See, for example, FIG. 16. The TEVA is formed in the TEVA opening from the TEVA layer. Further, the TEVA has a top surface that is heterogeneous, and that is rough or uneven. The top surface of the TEVA is rough or uneven because the TEVA layer is heterogeneous and is therefore removed at different rates during the second planarization.

At 1820, an upper ILD layer and an upper wire are formed on the device ILD layer and the TEVA. See, for example, FIG. 17. The upper wire overlies the TEVA and is recessed into a bottom of the upper ILD layer, such that a bottom surface of the upper wire is even or substantially even with a bottom surface of the upper ILD layer. The upper ILD layer and the upper wire may, for example, be components of a BEOL interconnect structure.

While the flowchart 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated circuit including: a conductive wire; a via dielectric layer overlying the conductive wire; a via extending through the via dielectric layer to the conductive wire, wherein the via has a first sidewall, a second sidewall, and a top surface, wherein the first and second sidewalls of the via are respectively on opposite sides of the via, wherein the first and second sidewalls of the via directly contact sidewalls of the via dielectric layer, wherein the top surface of the via is homogenous, and wherein the top surface of the via extends laterally from the first sidewall of the via to the second sidewall of the via; and a memory cell directly on the top surface of the via. In an embodiment, the memory cell includes: a bottom electrode overlying and directly contacting the via dielectric layer and the via; a data storage element overlying the bottom electrode; and a top electrode overlying the data storage element. In an embodiment, the data storage element includes a conductive filament. In an embodiment, the via dielectric layer includes a lower dielectric layer and an upper dielectric layer overlying and directly contacting the lower dielectric layer, wherein a width of the via continuously decreases from the top surface of the via to an interface between the lower and upper dielectric layers, and wherein a width of the via is substantially uniform from the interface to a bottommost surface of the via. In an embodiment, the via includes titanium nitride, tungsten, or titanium. In an embodiment, the integrated circuit further includes: a second via overlying and directly contacting the memory cell, wherein the second via includes a via body and a via liner, wherein the via liner cups an underside of the via body so as to line a bottom surface of the via body and sidewalls of the via body, and wherein the via liner and the via body are conductive and have top surfaces that are uneven; and a second conductive wire overlying and directly contacting the second via. In an embodiment, the via is completely homogeneous.

In some embodiments, the present application provides a method for forming an integrated circuit including: forming a via dielectric layer covering a conductive wire; performing an etch into the via dielectric layer to form an opening overlying and exposing the conductive wire; forming a conductive layer covering the via dielectric layer and completely filling the opening, wherein the conductive layer is homogeneous and directly contacts sidewalls of the via dielectric layer in the opening; performing a planarization into a top of the conductive layer until the via dielectric layer is reached to form a via in the opening from the conductive layer; and forming a memory cell directly on the via. In an embodiment, the forming of the memory cell includes: forming a bottom electrode layer directly on the via dielectric layer and the via; forming a data storage layer covering the bottom electrode layer; forming a top electrode layer covering the data storage layer; and patterning the top and bottom electrode layers and the data storage layer into the memory cell, wherein the memory cell includes a bottom electrode, a data storage element overlying the bottom electrode, and a top electrode overlying the data storage element. In an embodiment, the data storage layer includes a high κ dielectric layer and a conductive filament in the high κ dielectric layer, and wherein the high κ dielectric layer has a dielectric constant κ greater than about 3.9. In an embodiment, the conductive layer includes titanium nitride, tungsten, or titanium. In an embodiment, the planarization includes a CMP. In an embodiment, the forming of the via dielectric layer includes: forming a lower dielectric layer covering the conductive wire; and forming an upper dielectric layer covering the lower dielectric layer, wherein the upper and lower dielectric layers are different materials. In an embodiment, the performing of the etch includes: patterning a photoresist layer on the upper dielectric layer, wherein the photoresist layer has a layout of the opening; applying a first etchant to the upper dielectric layer with the photoresist layer in place until the lower dielectric layer is reached by the first etchant; and applying a second etchant to the lower dielectric layer with the photoresist layer in place until the conductive wire is reached by the second etchant. In an embodiment, the method further includes: forming a device dielectric layer covering the memory cell and the via dielectric layer; performing a second etch into the device dielectric layer to form a second opening overlying and exposing the memory cell; forming a second conductive layer covering the device dielectric layer and completely filling the second opening, wherein the second conductive layer is heterogeneous and directly contacts sidewalls of the device dielectric layer in the second opening; and performing a second planarization into the second conductive layer until the device dielectric layer is reached to form a second via in the second opening from the second conductive layer, wherein a top surface of the second via is uneven. In an embodiment, the forming of the second conductive layer includes: forming a via liner layer covering the device dielectric layer and lining the second opening; and forming a via body layer covering the via liner layer and filling the second opening over the via liner layer, wherein the second planarization is performed into both the via liner layer and the via body layer to form a via body and a via liner collectively defining the second via, wherein the via liner cups an underside of the via body and has a top surface vertically offset from a top surface of the via body. In an embodiment, the method further includes forming a second conductive wire overlying and directly contacting the second via.

In some embodiments, the present application provides another integrated circuit including: a lower wire; a via dielectric layer covering the lower wire; a first via extending through the via dielectric layer to direct contact with the lower wire, wherein the first via is a single material and directly contacts sidewalls of the via dielectric layer from a top of the via dielectric layer to a bottom of the via dielectric layer; a bottom electrode, a data storage element, and a top electrode stacked directly on the first via, wherein the data storage element is between the bottom electrode and the top electrode; a second via overlying and directly contacting the top electrode, wherein the second via includes a via body and a via liner, wherein the via body and the via liner are different conductive materials, wherein the via liner cups an underside of the via body and has a top surface vertically offset from a top surface of the via body; and an upper wire overlying and directly contacting the second via. In an embodiment, the integrated circuit further includes: a semiconductor substrate; a semiconductor device overlying the semiconductor substrate and recessed into a top of the semiconductor substrate; and an interconnect structure covering the semiconductor substrate and the semiconductor device, wherein the interconnect structure includes an interlayer dielectric (ILD) layer, a plurality of wires, and a plurality of vias, wherein the wires and the vias are alternatingly stacked in the ILD layer, wherein the wires include the lower wire, and wherein the wires and the vias define a conductive path electrically coupling the semiconductor device to the lower wire. In an embodiment, the via dielectric layer includes a lower dielectric layer and an upper dielectric layer overlying and directly contacting the lower dielectric layer, wherein the first via includes a pair of slanted sidewalls on opposite sides of the first via, and further includes a pair of vertical sidewalls on the opposite sides of the first via, wherein top edges of the slanted sidewalls are at a top surface of the first via, wherein bottom edges of the slanted sidewalls are at an interface between the lower and upper dielectric layers, wherein top edges of the vertical sidewalls are respectively at the bottom edges of the slanted sidewall, and wherein the bottom edges of the vertical sidewalls are at a bottom surface of the first via.

In some embodiments, the present application provides yet another integrated circuit including: a semiconductor substrate including a logic region and a memory region; a logic device recessed in a top of the semiconductor substrate and within the logic region of the semiconductor substrate; an access device recessed in the top of the semiconductor substrate and within the memory region of the semiconductor substrate; an interconnect structure covering the semiconductor substrate, the logic device, and the access device, wherein the interconnect structure includes a conductive wire recessed into a top of the interconnect structure and electrically coupled to the access device; a via dielectric layer overlying the interconnect structure and the conductive wire; a via overlying and directly contacting the conductive wire, wherein the via is a single material, and wherein via extends through the via dielectric layer and laterally contacts sidewalls of the via dielectric layer; and a memory cell directly on the top surface of the via and overlying the memory region. In an embodiment, the memory cell includes a bottom electrode, a data storage element overlying the bottom electrode, and a top electrode overlying the data storage element. In an embodiment, the via dielectric layer includes a lower dielectric layer and an upper dielectric layer, wherein the upper dielectric layer overlies and directly contacts the lower dielectric layer, wherein a width of the via is substantially uniform from the conductive wire to a location at which the lower and upper dielectric layers directly contact, and wherein the width of the via increases from the location to the top surface of the via.

In some embodiments, the present application provides another method for forming an integrated circuit including: forming a via dielectric layer covering a lower wire; performing a first etch into the via dielectric layer to form a first opening overlying and exposing the lower wire; forming a first conductive layer covering the via dielectric layer and completely filling the first opening, wherein the first conductive layer is a single material and directly contacts sidewalls of the via dielectric layer in the first opening; performing a first planarization into a top of the first conductive layer until the via dielectric layer is reached to form a first via in the first opening; forming a memory cell directly on the first via; forming a device dielectric layer covering the memory cell and the via dielectric layer; performing a second etch into the device dielectric layer to form a second opening overlying and exposing the memory cell; forming a second conductive layer covering the device dielectric layer and completely filling the second opening, wherein the second conductive layer includes multiple materials; performing a second planarization into a top of the second conductive layer until the device dielectric layer is reached to form a second via in the second opening, wherein the second via has a top surface that is uneven; and forming an upper wire overlying and directly contacting the second via. In an embodiment, the method further includes forming an interconnect structure on a semiconductor substrate, wherein the interconnect structure includes an interlayer dielectric (ILD) layer, a plurality of wires, and a plurality of vias, wherein the wires and the vias are alternatingly stacked in the ILD layer, and wherein the wires include the lower wire recessed into a top of the ILD layer. In an embodiment, the method further includes forming a semiconductor device in the semiconductor substrate, wherein the ILD covers the semiconductor device, and wherein the vias and the wires define a conductive path electrically coupling the semiconductor device to the lower wire. In an embodiment, the forming of the second conductive layer includes: forming a via liner layer covering the device dielectric layer, and further lining the second opening so as to partially fill the second opening; and forming a via body layer covering the via liner layer and filling a remainder of the second opening over the via liner layer, wherein the via liner layer and the via body layer are both conductive and have different hardnesses.

In some embodiments, the present application provides yet another method for forming an integrated circuit including: providing a substrate including a lower ILD layer and a lower wire recessed into a top of the lower ILD layer; forming a via dielectric layer covering the substrate and the lower wire; performing a first etch into the via dielectric layer to form an opening overlying and exposing the lower wire; forming a conductive layer covering the via dielectric layer and completely filling the opening, wherein the conductive layer is a single material and directly contacts the lower wire; performing a planarization into the conductive layer until the via dielectric layer is reached to form a via in the opening from the conductive layer; forming a bottom electrode layer covering the via dielectric layer and the via; forming a data storage layer covering the bottom electrode layer; forming a top electrode layer covering the data storage layer; forming a hard mask covering a memory cell region of the top electrode layer that overlies the via; performing a second etch into the top electrode layer with the hard mask in place to form a top electrode underlying the hard mask, wherein the second etch stops on the data storage layer; forming a dielectric spacer overlying the data storage layer and on sidewalls of the top electrode; and performing a third etch into the data storage layer and the bottom electrode layer with the hard mask and the dielectric spacer in place, wherein the third etch forms a data storage element and a bottom electrode underlying the top electrode, and wherein the third etch stops on the via dielectric layer. In an embodiment, the method further includes: forming a device dielectric layer covering the via dielectric layer and the hard mask; forming a second via overlying and directly contacting the top electrode, wherein the second via extends through the device dielectric layer and the hard mask to the top electrode; and forming a second wire overlying and directly contacting the second via. In an embodiment, the method further includes applying a forming voltage across the data storage element, from the bottom electrode to the top electrode, to form a conductive filament in the data storage element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
    a conductive wire;
    a lower via dielectric layer and an upper via dielectric layer stacked directly over the conductive wire and directly contacting each other at an interface;
    a memory cell overlying the upper via dielectric layer; and
    a via extending from the memory cell to the conductive wire and having a first sidewall at a first angle relative to the interface, wherein the via further has a second sidewall that is at a second angle relative to the interface and that directly contacts the upper via dielectric layer, wherein the second angle is less than the first angle, wherein individual edges of the first and second sidewalls directly contact adjacent to the interface, wherein a top of the via has a same material at the second sidewall and at a width-wise center of the via, wherein the lower via dielectric layer comprises carbon, and wherein the upper via dielectric layer comprises nitrogen.

2. The IC according to claim 1, wherein the first sidewall directly contacts the lower via dielectric layer.

3. The IC according to claim 1, wherein the via consists essentially of a single conductive material.

4. The IC according to claim 1, wherein the first angle is about 90 degrees.

5. The IC according to claim 1, wherein a width of the via is substantially uniform from the conductive wire to the interface, and wherein the width increases continuously and substantially linearly from the interface to the memory cell.

6. The IC according to claim 1, further comprising:
    an additional via overlying and directly on the memory cell, wherein the additional via comprises a conductive plug and a conductive liner cupping an underside of the conductive plug, and wherein a top surface of the conductive plug is entirely recessed below a top surface of the conductive liner.

7. An integrated circuit (IC) comprising:
    a wire;
    a lower dielectric layer and an upper dielectric layer stacked over the wire and directly contacting at an inter-dielectric interface;
    a metal-insulator-metal (MIM) structure directly contacting a first top surface portion of the upper dielectric layer and a second top surface portion of the upper dielectric layer that are respectively on opposite sides of the MIM structure;
    a via extending through the lower and upper dielectric layers, from the MIM structure to the wire, wherein the via has a single hardness linearly from the first top surface portion to the second top surface portion, and wherein the via juts laterally outward at a top of the via beginning at the inter-dielectric interface;
    an additional via overlying and directly on the MIM structure, wherein the additional via comprises a via body and a via liner cupping an underside of the via body; and
    an additional wire overlying the additional via and having a pair of bottom recesses respectively on opposite sides of the additional via when viewed in profile, wherein the via liner extends into and fills the bottom recesses.

8. The IC according to claim 7, wherein the via has a rectilinear profile.

9. The IC according to claim 7, wherein the via has a width that is substantially uniform from the wire to the inter-dielectric interface.

10. The IC according to claim 7, wherein the via has a width that increases continuously from the inter-dielectric interface to the first and second top surface portions.

11. The IC according to claim 7, wherein the additional via has a top surface that is uneven and symmetrical when viewed in profile.

12. The IC according to claim 7, wherein the via liner comprises a first liner layer and a second liner layer respectively and directly contacting the MIM structure and the via body, wherein the first liner layer directly contacts first sidewalls of the additional wire respectively in the bottom recesses, and wherein the second liner layer directly contacts second sidewalls of the additional wire respectively in the bottom recesses.

13. An integrated circuit (IC) comprising:
    a first wire;
    a memory cell overlying the first wire;
    a first via between and directly contacting the memory cell and the first wire, wherein an interface at which the first via and the memory cell directly contact has a single hardness;
    a second wire overlying the memory cell; and
    a second via extending from the second wire to the memory cell and comprising a via body and a via liner, wherein a top surface portion of the via body has a single elevation above the memory cell, wherein the via liner cups an underside of the via body and has a different hardness than the via body, and wherein the via liner has a first top surface portion and a second top surface portion that are vertically offset from the top surface portion of the via body and that are respectively on opposite sides of the via body.

14. The IC according to claim 13, wherein the first and second top surface portions of the via liner are vertically offset from the top surface portion of the via body by a common amount.

15. The IC according to claim 13, wherein the first and second top surface portions of the via liner are elevated above the top surface portion of the via body.

16. The IC according to claim 13, further comprising:
   a dielectric structure surrounding and directly contacting the first via.

17. The IC according to claim 13, wherein the first via and the via liner have a same metal nitride.

18. The IC according to claim 13, wherein the first via laterally bulges at a top of the first via, beginning at an inter-dielectric interface at which two different dielectric layers directly contact.

19. The IC according to claim 13, wherein the memory cell comprises a top metal electrode, wherein the via liner comprises multiple different layers respectively and directly contacting the top metal electrode and the via body, and wherein the multiple different layers respectively have high and low affinities for oxygen compared to the top metal electrode.

20. The IC according to claim 13, wherein the via body is completely recessed relative to the first and second top surface portions of the via liner.

\* \* \* \* \*